(12) United States Patent
Lin et al.

(10) Patent No.: US 10,950,477 B2
(45) Date of Patent: Mar. 16, 2021

(54) CERAMIC HEATER AND ESC WITH ENHANCED WAFER EDGE PERFORMANCE

(71) Applicant: Applied Materials, Inc., Santa Clara, CA (US)

(72) Inventors: Xing Lin, San Jose, CA (US); Jianhua Zhou, Campbell, CA (US); Zheng John Ye, Santa Clara, CA (US); Jian Chen, Fremont, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 342 days.

(21) Appl. No.: 15/212,695

(22) Filed: Jul. 18, 2016

(65) Prior Publication Data

US 2017/0040198 A1 Feb. 9, 2017

Related U.S. Application Data

(60) Provisional application No. 62/202,656, filed on Aug. 7, 2015.

(51) Int. Cl.
| | | |
|---|---|---|
| H01L 21/683 | (2006.01) | |
| H01L 21/67 | (2006.01) | |
| H01L 21/687 | (2006.01) | |
| H01J 37/32 | (2006.01) | |

(52) U.S. Cl.
CPC .... *H01L 21/6833* (2013.01); *H01J 37/32715* (2013.01); *H01L 21/67103* (2013.01); *H01L 21/68735* (2013.01)

(58) Field of Classification Search
CPC .............. H01L 21/6831–6833; H02N 13/00
See application file for complete search history.

(56) References Cited

U.S. PATENT DOCUMENTS

| | | | | |
|---|---|---|---|---|
| 5,748,434 A | * | 5/1998 | Rossman | ............ H01L 21/6831 361/234 |
| 6,478,924 B1 | * | 11/2002 | Shamouilian | ..... H01J 37/32706 |
| 8,236,443 B2 | | 8/2012 | Snyder et al. | |

(Continued)

FOREIGN PATENT DOCUMENTS

| | | |
|---|---|---|
| CN | 102067302 A | 5/2011 |
| CN | 103890928 A | 6/2014 |

OTHER PUBLICATIONS

Office Action from Chinese Patent Application No. 201710523780.1 dated Feb. 3, 2020.

(Continued)

*Primary Examiner* — Jared Fureman
*Assistant Examiner* — Christopher J Clark
(74) *Attorney, Agent, or Firm* — Patterson + Sheridan, LLP (57) ABSTRACT

Embodiments of the present disclosure provide an improved electrostatic chuck for supporting a substrate. The electrostatic chuck comprises a chuck body coupled to a support stem, the chuck body having a substrate supporting surface, a plurality of tabs projecting from the substrate supporting surface of the chuck body, wherein the tabs are disposed around the circumference of the chuck body, an electrode embedded within the chuck body, the electrode extending radially from a center of the chuck body to a region beyond the plurality of tabs, and an RF power source coupled to the electrode through a first electrical connection.

9 Claims, 10 Drawing Sheets

(56) References Cited

U.S. PATENT DOCUMENTS

| | | |
|---|---|---|
| 2005/0031796 A1 | 2/2005 | Wu et al. |
| 2009/0284894 A1 | 11/2009 | Cooke |
| 2009/0314433 A1* | 12/2009 | Hoffman ............ H01L 21/6833 |
| | | 156/345.48 |
| 2010/0039747 A1 | 2/2010 | Sansoni et al. |
| 2013/0107415 A1* | 5/2013 | Banna ................ H01L 21/6831 |
| | | 361/234 |
| 2014/0069584 A1* | 3/2014 | Yang ................ H01L 21/67069 |
| | | 156/345.44 |
| 2016/0002779 A1 | 1/2016 | Lin et al. |
| 2016/0035610 A1* | 2/2016 | Park et al. ............... 156/345.29 |

OTHER PUBLICATIONS

Office Action from Chinese Patent Application No. 201710523780.1 dated Jul. 17, 2020.
Office Action from Taiwan Patent Application No. 105124923 dated Mar. 29, 2019.

* cited by examiner

CERAMIC HEATER AND ESC WITH ENHANCED WAFER EDGE PERFORMANCE

CROSS-REFERENCE TO RELATED APPLICATIONS

This application claims priority to U.S. provisional patent application Ser. No. 62/202,656, filed Aug. 7, 2015, which is herein incorporated by reference.

FIELD

Embodiments of the present disclosure generally relate to an apparatus for processing semiconductor substrates. More particularly, embodiments of the present disclosure relate to an electrostatic chuck used in a plasma chamber.

BACKGROUND

Plasma enhance processes, such as plasma enhanced chemical vapor deposition (PECVD) process, high density plasma chemical vapor deposition (HDPCVD) process, plasma immersion ion implantation process (P3I), and plasma etch process, have become essential in semiconductor processing. Plasma provides many advantages in manufacturing semiconductor devices. For example, using plasma enables a wide range of applications due to lowered processing temperature, plasma enhanced deposition has excellent gap-fill for high aspect ratio gaps and high deposition rates.

One problem that occurs during plasma processing is process non-uniformities proximate an edge of a substrate due to the differing electrical and thermal properties of the materials used to fabricate components of the electrostatic chuck and the substrate. In addition, due to the RF standing wave effect, the electromagnetic field above the substrate is not uniform, resulting in a plasma to be formed having a plasma sheath that bends towards the substrate proximate the edge of the substrate. Such bending of the plasma sheath leads to differences in the ion trajectories bombarding the substrate proximate the edge of the substrate as compared to the center of the substrate, thereby causing a non-uniform processing of the substrate and thus affecting overall critical dimension uniformity.

Therefore, there is a need for an improved electrostatic chuck that provides an enhanced substrate edge electromagnetic field and uniform plasma performance.

SUMMARY

Embodiments of the present disclosure provide an improved electrostatic chuck for supporting a substrate. In one embodiment, the electrostatic chuck comprises a chuck body coupled to a support stem, the chuck body having a substrate supporting surface, a plurality of tabs projecting from the substrate supporting surface of the chuck body, wherein the tabs are disposed around the circumference of the chuck body, an electrode embedded within the chuck body, the electrode extending radially from a center of the chuck body to a region beyond the plurality of tabs, and an RF power source coupled to the electrode through a first electrical connection.

In another embodiment, the electrostatic chuck comprises a body coupled to a support stem, the body having a substrate supporting surface, an annular shoulder projecting from the substrate supporting surface, the annular shoulder being disposed at the periphery of the body, an inner electrode embedded within the body, the inner electrode extending radially from a center of the body to a region adjacent to the annular shoulder, an outer electrode embedded within the body, the outer electrode is disposed radially external to the inner electrode, the outer electrode extending radially beneath the annular shoulder, wherein the outer electrode is disposed relatively below the inner electrode, a conductive connection connecting the inner electrode and the outer electrode, and an RF power source coupled to the inner electrode through a first electrical connection.

In yet another embodiment, the electrostatic chuck comprises a chuck body coupled to a support stem, the chuck body having a substrate supporting surface, an annular shoulder projecting from the substrate supporting surface, the annular shoulder being disposed at the periphery of the chuck body, an inner electrode embedded within the chuck body, the inner electrode extending radially from a center of the chuck body to a region adjacent to the annular shoulder, an outer electrode embedded within the chuck body, the outer electrode is disposed radially external to the inner electrode, the outer electrode extending radially beneath the annular shoulder, and a first power source coupled to the outer electrode through a first variable capacitor, the first power source provides an RF bias voltage to the outer electrode via a first electrical connection.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Exemplary Chamber Hardware

Figure 1:
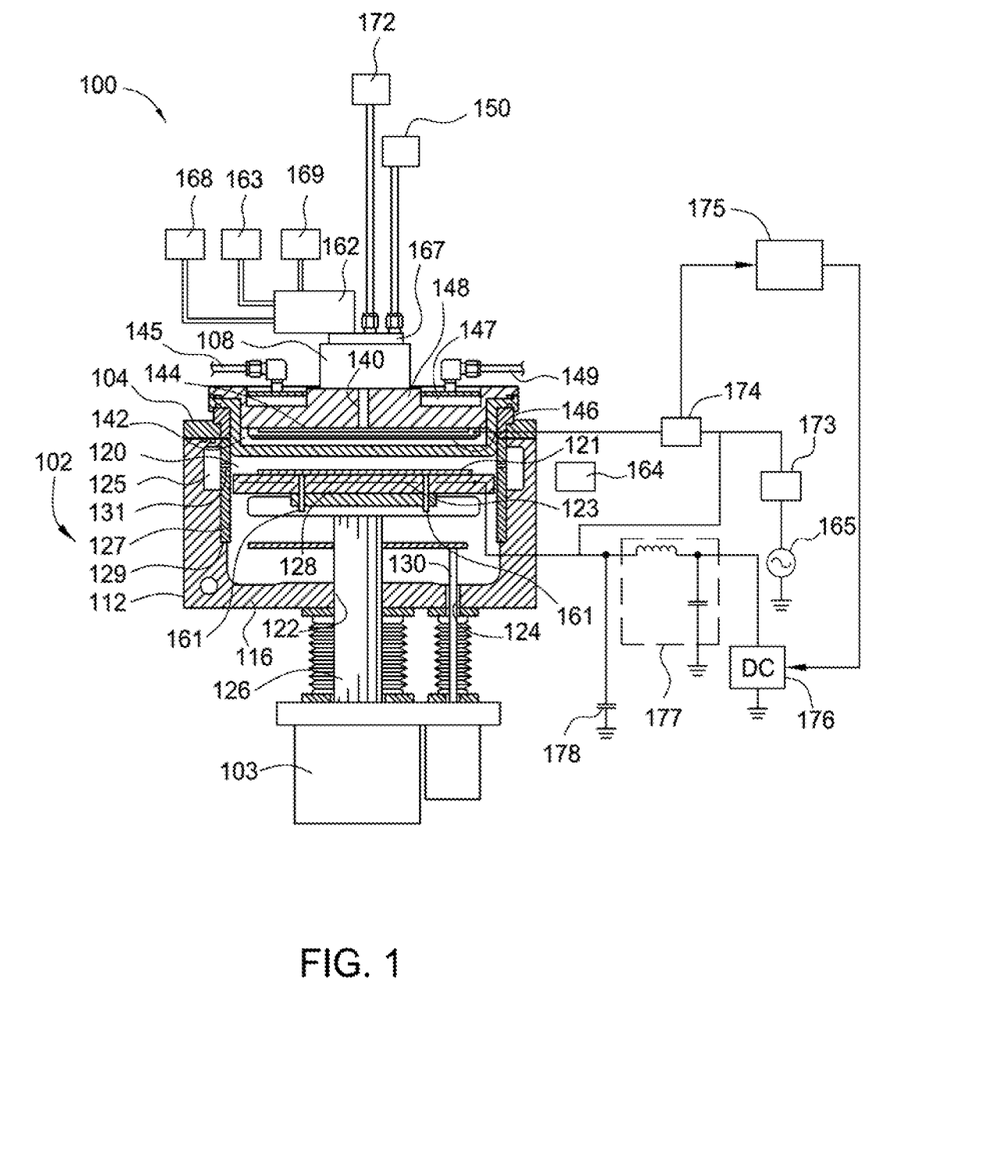
FIG. 1 illustrates a cross sectional view of an exemplary PECVD system that may be used to practice various embodiments of the present disclosure.

FIG. 1 illustrates a cross sectional view of an exemplary PECVD system 100 that may be used to practice various embodiments of the present disclosure. It should be noted that although a PECVD system is described in this application, apparatus of the present disclosure may apply to any suitable plasma process using an electrostatic chuck or a substrate support. The PECVD system 100 generally includes a chamber body 102 supporting a chamber lid 104. The chamber lid 104 may be attached to the chamber body 102 by a hinge (not shown). The chamber body 102 includes sidewalls 112 and a bottom wall 116 defining a processing region 120. The chamber lid 104 may include one or more gas distribution systems 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of an electrostatic chuck passes through the passage 122. A rod 130 configured to activate substrate lift pins 161 passes through the passage 124.

A chamber liner 127 made of ceramic or the like is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the pumping channel 125.

The gas distribution system 108 is configured to deliver reactant and cleaning gases and is disposed through the chamber lid 104 to deliver gases into the processing region 120. The gas distribution system 108 includes a gas inlet passage 140 which delivers gas into a shower head assembly 142. The showerhead assembly 142 is comprised of an annular base plate 148 having a blocker plate 144 disposed intermediate to a faceplate 146.

A cooling channel 147 is formed in the base plate 148 of the gas distribution system 108 to cool the base plate 148 during operation. A cooling inlet 145 delivers a coolant fluid, such as water or the like, into the cooling channel 147. The coolant fluid exits the cooling channel 147 through a coolant outlet 149.

The chamber lid 104 has matching passages to deliver gases from one or more gas inlets 168, 163, 169 through a remote plasma source 162 to a gas inlet manifold 167 positioned on top of the chamber lid 104. The PECVD system 100 may include one or more liquid delivery sources 150 and one or more gas sources 172 configured to provide a carrier gas and/or a precursor gas.

The electrostatic chuck 128 is configured for supporting and holding a substrate being processed. The electrostatic chuck 128 may comprise at least one electrode 123 to which a voltage is applied to electrostatically secure a substrate thereon. The electrode 123 is powered by a direct current (DC) power supply 176 connected to the electrode 123 via a low pass filter 177. The electrostatic chuck 128 may be monopolar, bipolar, tri-polar, DC, interdigitated, zonal, and the like.

In one embodiment, the electrostatic chuck 128 is movably disposed in the processing region 120 driven by a drive system 103 coupled to the stem 126. The electrostatic chuck 128 may comprise heating elements, for example resistive elements, to heat a substrate positioned thereon to a desired process temperature. Alternatively, the electrostatic chuck 128 may be heated by an outside heating element such as a lamp assembly. The drive system 103 may include linear actuators, or a motor and reduction gearing assembly, to lower or raise the electrostatic chuck 128 within the processing region 120.

An RF source 165 may be coupled to the shower head assembly 142 and the electrode 123 through an impedance matching circuit 173. The faceplate 146 of the showerhead assembly 142 and the electrode 123, which may be grounded via a high pass filter, such as a capacitor 178, form a capacitive plasma generator. The RF source 165 provides RF energy to the showerhead assembly 142 to facilitate generation of a capacitive plasma between the faceplate 146 of the showerhead assembly 142 and the electrostatic chuck 128. The electrode 123 provides both a ground path for the RF source 165 and an electric bias from the DC source 176 to enable electrostatic clamping of the substrate.

The RF source 165 may comprise a high frequency radio frequency (HFRF) power source, e.g., a 13.56 MHz RF generator, and a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

In certain embodiments, properties of a substrate secured on the electrostatic chuck 128 may be monitored during a plasma process. In certain embodiments, flatness of a substrate secured on the electrostatic chuck 128 may be monitored during a plasma process. In one embodiment, flatness of a substrate secured on the electrostatic chuck 128 may be monitored by measuring characteristics of the electrostatic chuck 128 with the substrate secured thereon. Characteristics of the electrostatic chuck 128 may be measured by a sensor 174 connected with the faceplate 146. The sensor 174 may be a VI probe connected between the faceplate 146 and the impedance matching circuit 173. In some embodiments, the sensor 174 may be configured to measure capacitance between the faceplate 146 and the electrode 123 since capacitance between the faceplate 146 and the electrode 123 is effected by the flatness of a substrate 121 positioned between the faceplate 146 and the electrode 123.

An electrostatic chuck, such as the electrostatic chuck 128, may have an increased capacitive reactance when a substrate disposed thereon becomes less flat. When a substrate is not flat, for example deformed from the heat of the plasma, there is non uniform distribution of air gap between the substrate and the electrostatic chuck 128. Therefore, variation in flatness of the substrate in an electrostatic chuck results in variation of capacitance of the plasma reactor, which may be measured by variation of imaginary impedance of the electrostatic chuck. In such a case, the sensor 174 may be configured to measure impedance of the electrostatic chuck 128 by measuring voltage and current of the capacitor formed by the faceplate 146 and the electrode 123, thereby monitoring the flatness of a substrate secured thereon.

As shown in FIG. 1, the sensor 174 may be connected to a system controller 175. The system controller 175 may be configured to calculate and adjust the flatness of the substrate 121 being processed in the PECVD system 100. In one embodiment, the system controller 175 may calculate flatness or chucking status of the substrate 121 by monitoring characteristics, such as imaginary impedance, of the electrostatic chuck 128. When measurement of the imaginary impedance indicates that the substrate 121 decreases in flatness, the system controller 175 may increase chucking power by adjusting the DC source 176. In one embodiment, decreased flatness of the substrate 121 may be indicated by negatively increased imaginary impedance of the electrostatic chuck 128.

Exemplary Electrostatic Chuck

Figure 2A:
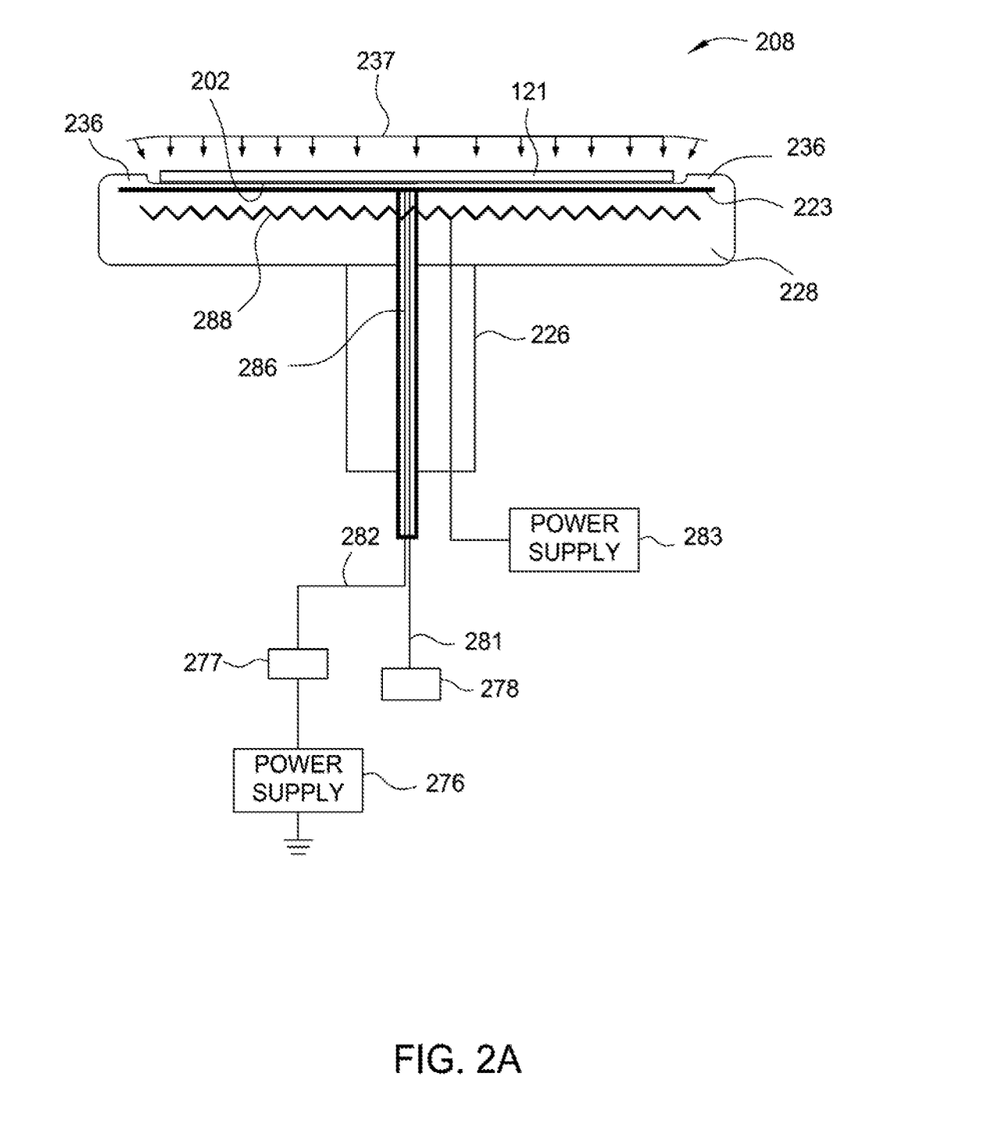
FIG. 2A is a schematic cross-sectional view of an electrostatic chuck according to one embodiment of the present disclosure.

FIG. 2A is a schematic cross-sectional view of an electrostatic chuck 208 according to one embodiment of the present disclosure. The electrostatic chuck 208 may be used to replace the electrostatic chuck 128 of FIG. 1. The electrostatic chuck 208 comprises a chuck body 228 coupled to a support stem 226. The chuck body 228 has a top surface 202 configured to provide support and clamp the substrate 121 during processing. The chuck body 228 of the electrostatic chuck 208 has an annular shoulder 236 disposed around the periphery of the top surface 202. The annular shoulder 236 is disposed at the periphery of the electrostatic chuck 208. The annular shoulder 236 projects from the top surface 202 and is configured to laterally confine the movement of the substrate 121 in a predetermined position. The height of the annular shoulder 236 may be relatively lower or greater than the thickness of the substrate 121.

The chuck body 228 comprises a single electrode 223 coupled to a conductive member 286. The electrode 223 may be a conductive mesh in substantially parallel to the substrate 121. The electrode 223 may be arranged in any configuration or pattern such that the electrodes are evenly distributed across the top surface 202. For example, the electrode 223 may be arranged in a grid-like, a pixel-like or dot-like configuration. The conductive member 286 may be a rod, a tube, wires, or the like, and be made of a conductive material, such as molybdenum (Mo), tungsten (W), or other material with a substantially similar coefficient of expansion with other materials comprising the body 228. The electrode 223 may be made from an electrically conductive material, for example, metals such as copper, nickel, chromium, aluminum, and alloys thereof.

In one embodiment as shown, the electrostatic chuck 208 uses a single piece of the electrode 223 to maintain substantially uniform voltage between the electrode 223 and the substrate 121. Particularly, the electrode 223 extends from a center of the electrostatic chuck 208 to an area beyond the edge of the substrate 121. The electrode 223 may extend radially beyond the edge of the substrate 121 any distance that is suitable to provide a more uniform electromagnetic field. In one example, the electrode 223 extends radially from the center of the electrostatic chuck 208 to the annular shoulder 236. In another example, the electrode 223 extends radially from the center of the electrostatic chuck 208 to a region beneath the annular shoulder 236. By extending the electrode 223 beyond the edge of the substrate 121, a more uniform electromagnetic field 237 can be produced above the substrate 121, which in turn extends the plasma beyond the edge of the substrate. As a result, a bending of the plasma sheath towards the substrate proximate the edge of the substrate (as discussed in the background) is reduced or eliminated.

The electrode 223 may be coupled to one or more power sources. For example, the electrode 223 may be coupled to a chucking power 278 (via an electrical connection 281), such as a DC or AC power supply, to facilitate securing the substrate 121 on the electrostatic chuck 208. In some embodiments, the electrode 223 may be coupled to an RF power source 276 through a matching network 277. The RF power may provide a processing power, for example a bias power to the substrate 121 to facilitate directing plasma species towards the substrate 121. The RF power source 276 may provide power up to about 12000 W at a frequency of up to about 60 MHz, or in some embodiments, about 400 kHz, or in some embodiments, about 2 MHz, or in some embodiments, about 13.56 MHz. The electrode 223 may also function as an RF ground, wherein RF power is coupled to ground by a electrical connection 282.

The chuck body 228 comprises, or is composed of, a dielectric material capable of providing sufficient chucking force to the substrate in a temperature range of about −20° C. to about 850° C., such as about 350° C. to about 700° C., for example about 650° C. The dielectric material may have a relatively low RF electrical field absorption that allows an RF electric field emanating from the electrode 223 to be capacitively coupled through the dielectric. Suitable materials may include, but are not limited to aluminum nitride (AlN), aluminum oxide ($Al_2O_3$), silicon dioxide ($SiO_2$), silicon carbide, boron carbide, boron nitride, yttrium oxide, etc.

In some embodiments, the chuck body 228 may include one or more embedded heaters 288 to provide heat to the chuck body 228. The heat from the heater 288 is then transferred to the substrate 121 to enhance a fabrication process, such as a deposition process. The heater 288 may or may not be positioned in parallel to the electrode 223. Although the heater 288 is shown in a position below the electrode 223, the electrode may be disposed along the same plane as, or above the heater 288. The heater 288 may be a single continuous metal line or in the form of discrete metal lines. The heater 288 may be any heating device that is suitable for providing inductive or resistive heating to the electrostatic chuck.

The heater 288 is coupled to a power supply 283 through the support stem 226 to supply power to the heater 288. The power supply 283 may include a direct current (DC) power source, an alternating current (AC) power source, or a combination of both. In one embodiment, the power supply 283 is an alternating current (AC) power source to provide AC signal to the heater 288. The heater 288 may be composed of a resistive metal, a resistive metal alloy, or a combination of the two. Suitable materials for the heating elements may include those with high thermal resistance, such as tungsten (W), molybdenum (Mo), titanium (Ti), or the like. The heater 288 may also be fabricated with a material having thermal properties, e.g., coefficient of thermal expansion, substantially similar to that of the material comprising the chuck body 228 to reduce stress caused by mismatched thermal expansion.

Figure 2B:
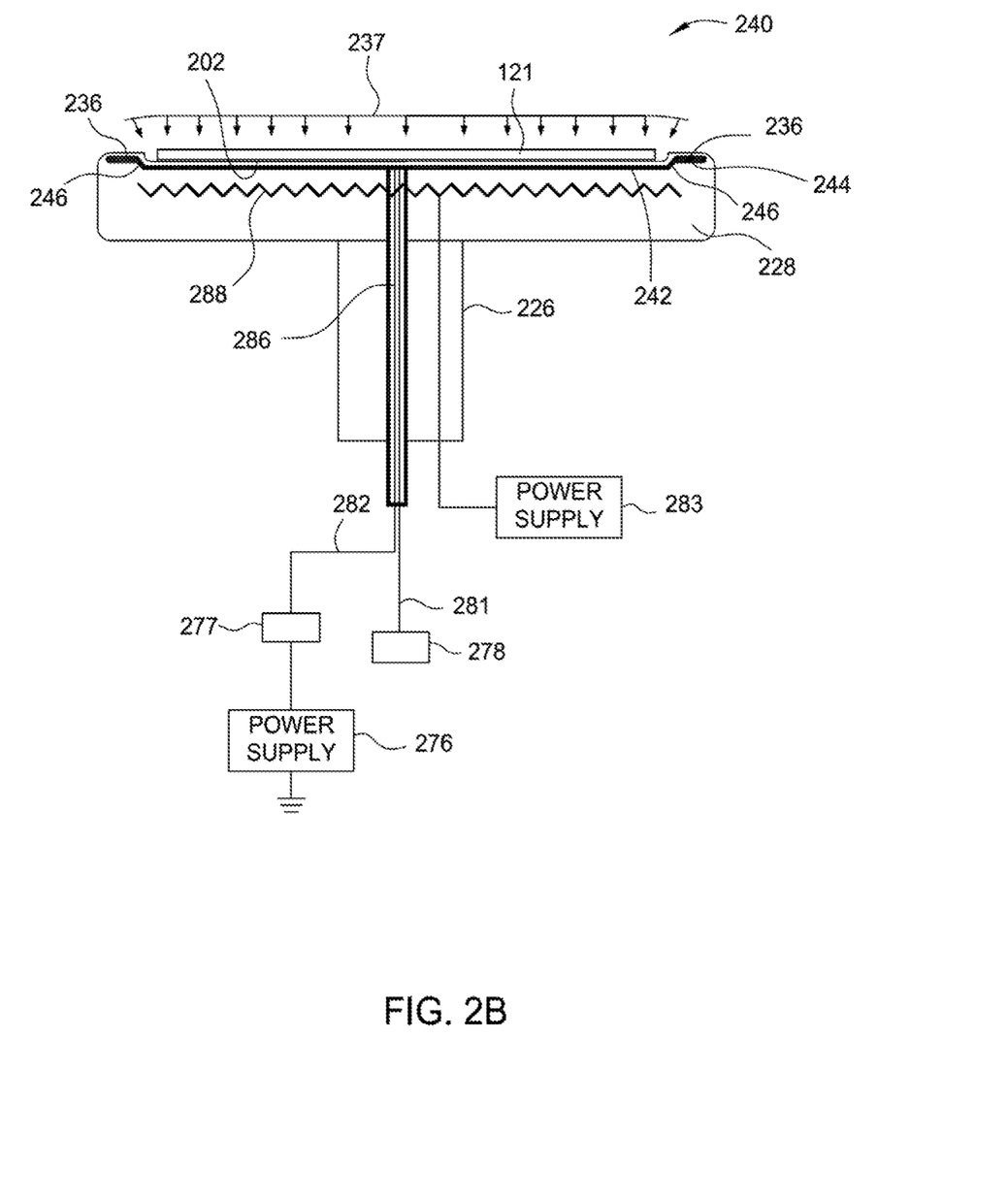
FIG. 2B illustrates a schematic cross-sectional view of an electrostatic chuck according to another embodiment of the present disclosure.

FIG. 2B illustrates a schematic cross-sectional view of an electrostatic chuck 240 according to another embodiment of the present disclosure. The electrostatic chuck 240 is substantially identical to the electrostatic chuck 208 except for a dual electrode design is adapted. For sake of clarity, only the arrangement of the electrodes will be discussed. In this embodiment, the electrostatic chuck 240 comprises two separate electrodes, i.e., an inner electrode 242 and an outer electrode 244 surrounding the inner electrode 242. The inner electrode 242 and the outer electrode 244 may be concentric. In one embodiment, the inner electrode 242 and the outer electrode 244 are not-coplanar and can be electrically connected to each other via an electrical connection 246. In one aspect as shown, the outer electrode 244 is being arranged relatively above with respect to the inner electrode 242. The inner electrode 242 may be disposed such that a distance between the inner electrode 242 and the top surface 202 is the same, or different (greater or smaller) than that of a distance between the outer electrode 244 and a top surface of the annular shoulder 236.

The inner electrode 242 may be fabricated from the same, or in some embodiments, a different material, than the outer electrode 244. Suitable material for the inner and outer electrodes 242, 244 may be those discussed above with respect to the electrode 223. The inner electrode 242 and the outer electrode 244 may be powered by the power source 276, 278 in a way as discussed above with respect to FIG. 2A. Alternatively, the inner electrode 242 and the outer electrode 244 may be powered by respective power source, which may be an RF power source, a DC power source, or a combination of both.

The inner electrode 242 may extend radially from a center of the electrostatic chuck 240 to an area beyond the edge of the substrate 121. In one embodiment, the inner electrode 242 extends beyond the edge of the substrate 121 to the annular shoulder 236, thereby providing a uniform electromagnetic field above the substrate 121. The outer electrode 244 may extend radially to a region beneath the annular shoulder 236, thereby providing a uniform electromagnetic field above the annular shoulder 236. The combination of the inner and outer electrodes 242, 244 provides a uniform electromagnetic field 239 above the substrate 121 and the annular shoulder 236, extending the plasma beyond the edge of the substrate. As a result, a bending of the plasma sheath towards the substrate proximate the edge of the substrate (as discussed in the background) is reduced or eliminated.

Figure 2C:
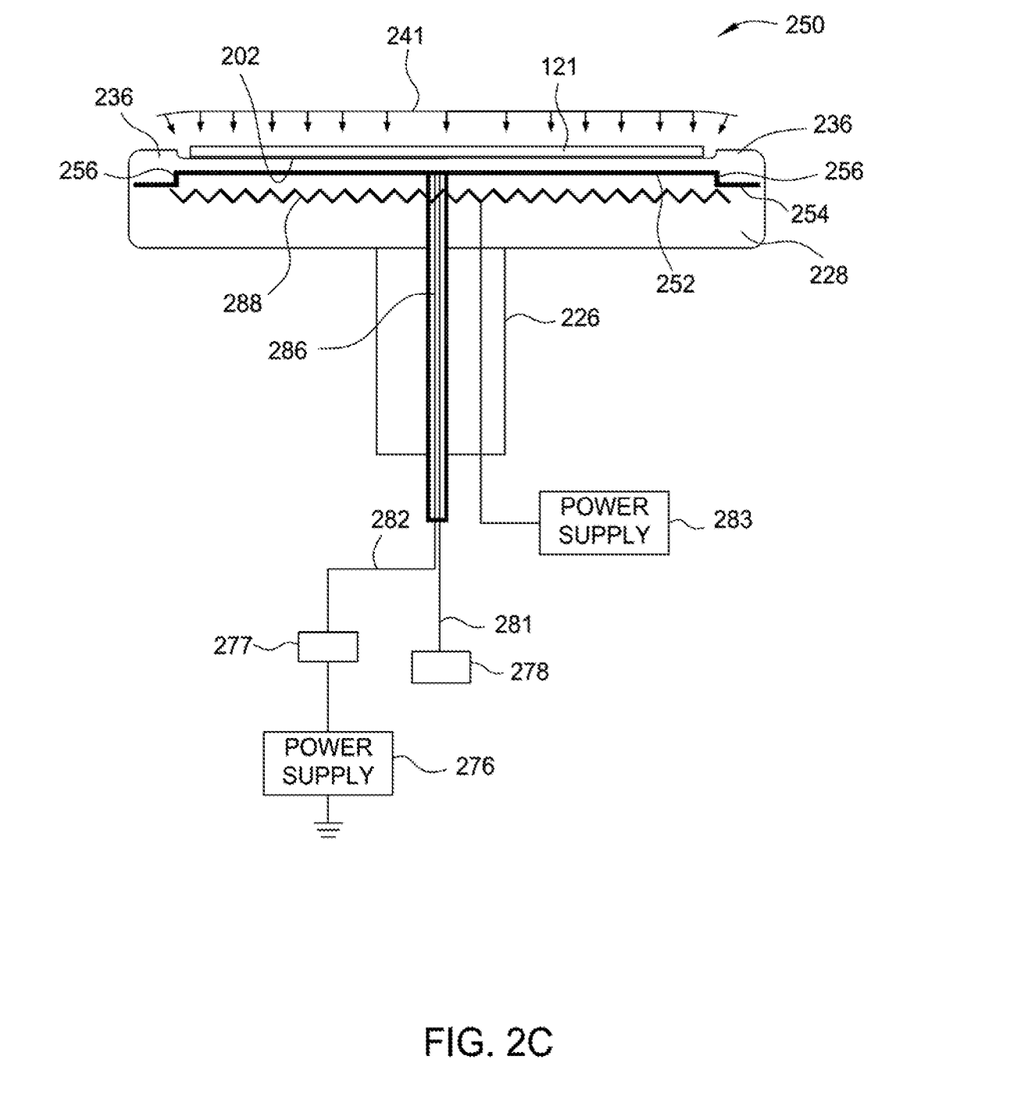
FIG. 2C illustrates a schematic cross-sectional view of an electrostatic chuck according to another embodiment of the present disclosure.

FIG. 2C illustrates a schematic cross-sectional view of an electrostatic chuck 250 according to another embodiment of the present disclosure. The electrostatic chuck 250 is substantially identical to the electrostatic chuck 240 except that the outer electrode is being arranged relatively below with respect to the inner electrode. In this embodiment, the electrostatic chuck 250 comprises two separate electrodes, i.e., an inner electrode 252 and an outer electrode 254 surrounding the inner electrode 252. The inner electrode 252 and the outer electrode 254 may be concentric. In one embodiment, the inner electrode 252 and the outer electrode 254 are not-coplanar and can be electrically connected to each other via a conductive connection 256. The outer electrode 254 may be disposed such that it is relatively higher the inner electrode 252, or relatively below the inner electrode 252 as shown (that is, the distance between the outer electrode 254 and the top surface 202 of the chuck body 228 is greater than the distance between the inner electrode 252 and the top surface 202 of the chuck body 228). Having the outer electrode 254 disposed at an elevation lower than that of the inner electrode 252 may result in bending of the electromagnetic field proximate the edge of the substrate and thus compensating the RF standing wave effect. As a result, a uniform electromagnetic field 241 above the substrate 121 and the annular shoulder 236 is provided.

Similarly, the inner electrode 252 may be fabricated from the same, or in some embodiments, a different material, than the outer electrode 254. Suitable material for the inner and outer electrodes 252, 254 may be those discussed above with respect to the electrode 223. The inner electrode 252 and the outer electrode 254 may be powered by the power source 276, 278 in a way as discussed above with respect to FIG. 2A. Alternatively, the inner electrode 242 and the outer electrode 244 may be powered by respective power source, which may be an RF power source, a DC power source, or in combination.

In some embodiments, the chuck body 228 may include one or more embedded heaters 288 to provide heat to the chuck body 228. The heater 288 may be positioned in a position below the inner electrode 252 as shown, or the heater 288 may be disposed along the same plane as, or above the inner electrode 252. The heater 288 may be a single continuous metal line or in the form of discrete metal lines. The heater 288 may be any heating device that is suitable for providing inductive or resistive heating to the electrostatic chuck.

Figure 3A:
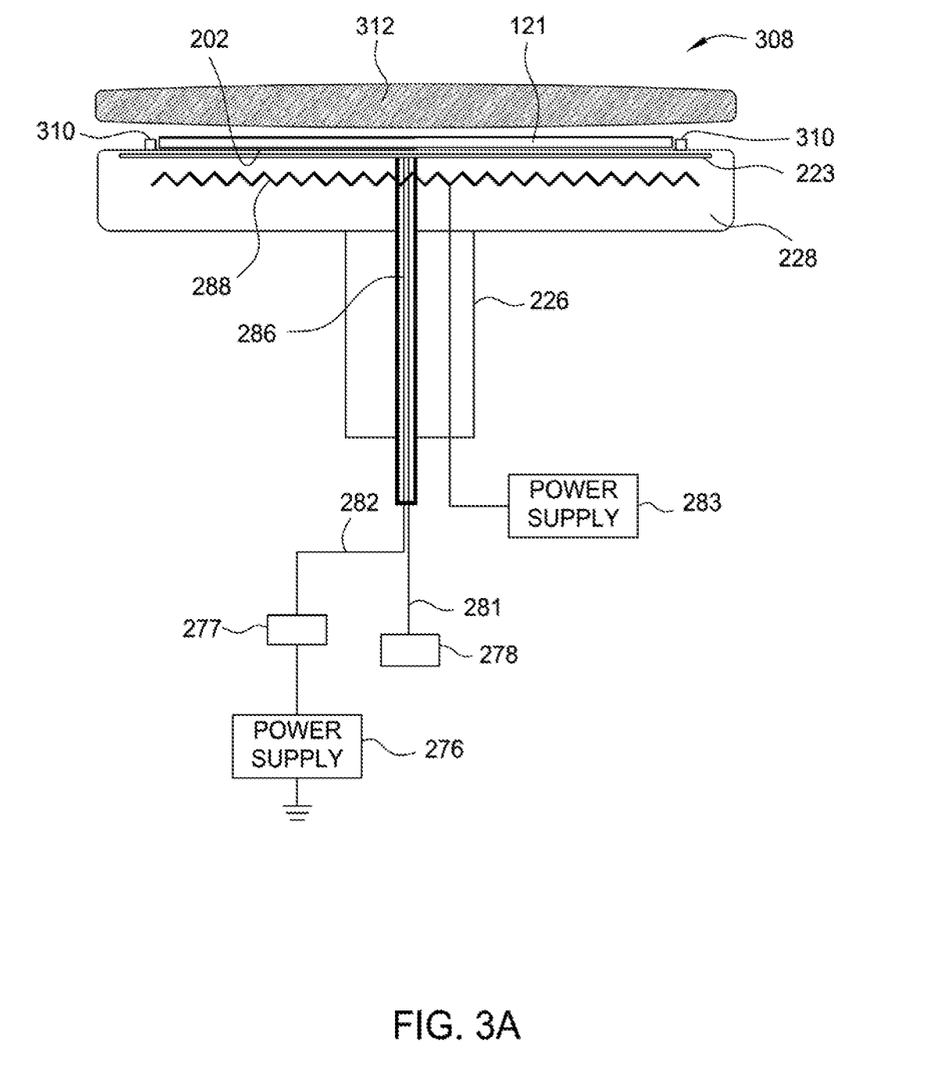
FIGS. 3A to 3C illustrate schematic cross-sectional views of an electrostatic chuck according to embodiments of the present disclosure.
Figure 3B:
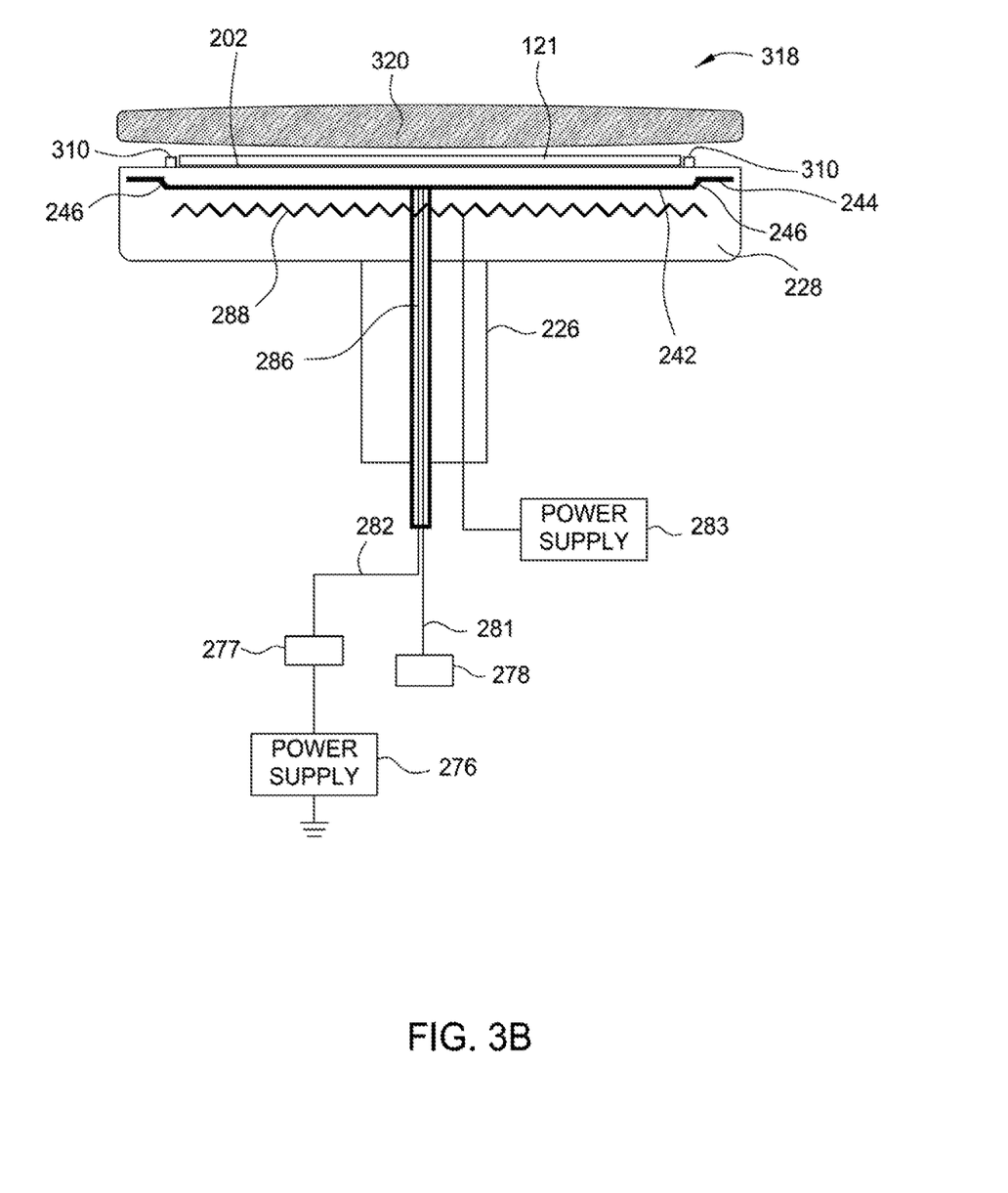
Figure 3C:
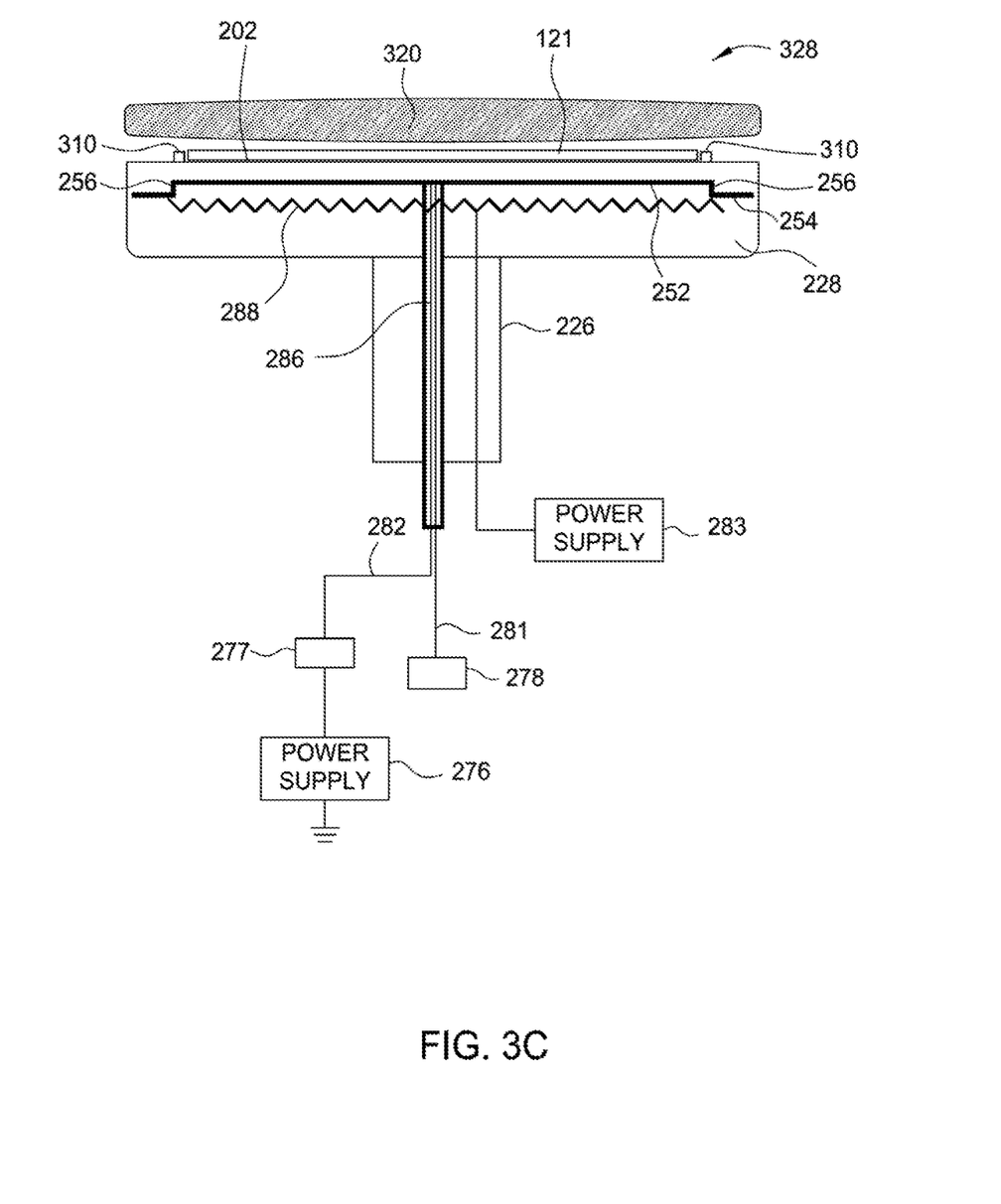

FIGS. 3A to 3C illustrate schematic cross-sectional views of an electrostatic chuck according to embodiments of the present disclosure. Embodiments shown in FIGS. 3A to 3C are substantially identical to those shown in FIGS. 2A to 2C except for the annular shoulder 236 is being replaced by multiple tabs or protrusions, which serve as a mechanism to confine the movement of the substrate 121 in a predetermined position during process. In the embodiment of FIG. 3A, a plurality of tabs 310 (only two tabs are shown) may be equally spaced apart around the circumference of the electrostatic chuck 308. In one example, three tabs are used. In another example, four tabs are used. It is contemplated that more or less tabs are also contemplated. The tabs 310 project from the top surface 202 and may have a height of about 2 mm to about 5 mm. While the tab is shown and discussed, any protrusion with a suitable shape such as rectangular, rhombus, square, hemispherical, hexagonal, or triangular, or mixtures of differently shaped protrusions may also be used to confine the movement of the substrate 121.

Similar to the embodiment of FIG. 2A, the electrode 223 extends from a center of the electrostatic chuck 308 to an area beyond the edge of the substrate 121. The electrode 223 may extend radially beyond the edge of the substrate 121 any distance suitable to provide a more uniform electromagnetic field. In one example, the electrode 223 extends radially from the center of the electrostatic chuck 308 to a region beyond the tabs 310. By extending the electrode 223 beyond the edge of the substrate 121, a more uniform electromagnetic field can be produced above the substrate 121, which in turn extends the plasma beyond the edge of the substrate. The arrangement of the tabs 310 and the electrode 223 allow a very flat and uniform plasma boundary 312 contacting the upper surface of the electrostatic chuck 308. As a result, a uniform processing of the substrate is achieved.

FIG. 3B is similar to FIG. 3A except that a dual electrode design, such as one shown in FIG. 2B, is adapted. Like the embodiment of FIG. 2B, the electrostatic chuck 318 comprises two separate electrodes, i.e., an inner electrode 242 and an outer electrode 244 surrounding the inner electrode 242. The inner electrode 242 and the outer electrode 244 may be concentric. In one embodiment, the inner electrode 242 and the outer electrode 244 are not-coplanar and can be electrically connected to each other via an electrical connection 246. The distance between the inner electrode 242 and the top surface 202 may be greater than the distance between the outer electrode 244 and the top surface 202 as shown, or smaller than the distance between the outer electrode 244 and the top surface 202. These distances may vary to adjust the electromagnetic field above the substrate. The non-coplanar electrode design also functions as an additional way to adjust the electromagnetic field proximate the edge of the substrate.

The inner electrode 242 may be fabricated from the same, or in some embodiments, a different material, than the outer electrode 244. Suitable material for the inner and outer electrodes 242, 244 may be those discussed above with respect to the electrode 223. The inner electrode 242 and the outer electrode 244 may be powered by the power source 276, 278 in a way as discussed above with respect to FIG. 2A. Alternatively, the inner electrode 242 and the outer electrode 244 may be powered by respective power source, which may be an RF power source, a DC power source, or in combination.

The inner electrode 242 may extend radially from a center of the electrostatic chuck 318 to an area beyond the edge of the substrate 121. In one embodiment, the inner electrode 242 extends beyond the edge of the substrate 121 to the tabs 310, thereby providing a uniform electromagnetic field above the substrate 121. The outer electrode 244 may extend radially from the edge of the substrate 121 to the edge of the periphery of the electrostatic chuck 318, thereby providing a uniform electromagnetic field above the tabs 310. The combination of the tabs 310 and the inner and outer electrodes 242, 244 extends the plasma beyond the edge of the substrate, providing a very flat and uniform plasma boundary 320 contacting the upper surface of the electrostatic chuck 318. As a result, a uniform processing of the substrate is achieved.

FIG. 3C is similar to FIG. 3A except that the outer electrode is being arranged relatively below the inner electrode. Like the embodiment of FIG. 2C, the electrostatic chuck 328 comprises two separate electrodes, i.e., an inner electrode 252 and an outer electrode 254 surrounding the inner electrode 252. The inner electrode 252 and the outer electrode 254 may be concentric. In one embodiment, the inner electrode 252 and the outer electrode 254 are not-coplanar and can be electrically connected to each other via a conductive connection 256. The non-coplanar electrode design functions as an additional way to adjust the electromagnetic field proximate the edge of the substrate. The outer electrode 254 may be disposed such that it is relatively below the inner electrode 252 as shown, or relatively higher the inner electrode 252. Having the outer electrode 254 disposed at an elevation lower than that of the inner electrode 252 may result in a very flat and uniform plasma boundary 330 contacting the upper surface of the electrostatic chuck 318. As a result, a uniform processing of the substrate is achieved.

The inner electrode 252 may be fabricated from the same, or in some embodiments, a different material, than the outer electrode 254. Suitable material for the inner and outer electrodes 252, 254 may be those discussed above with respect to the electrode 223. The inner electrode 252 and the outer electrode 254 may be powered by the power source 276, 278 in a way as discussed above with respect to FIG. 2A. Alternatively, the inner electrode 252 and the outer electrode 254 may be powered by respective power source, which may be an RF power source, a DC power source, or in combination.

In some embodiments, instead of using the tabs 310, the electrostatic chuck 308, 318, 328 may use a ledge ring for supporting the substrate 121. Alternatively, the substrate 121 may sit on bumps or projections of any suitable shape such as rectangular, rhombus, square, hemispherical, hexagonal, triangular protrusions or mixtures of differently shaped protrusions.

Figure 4A:
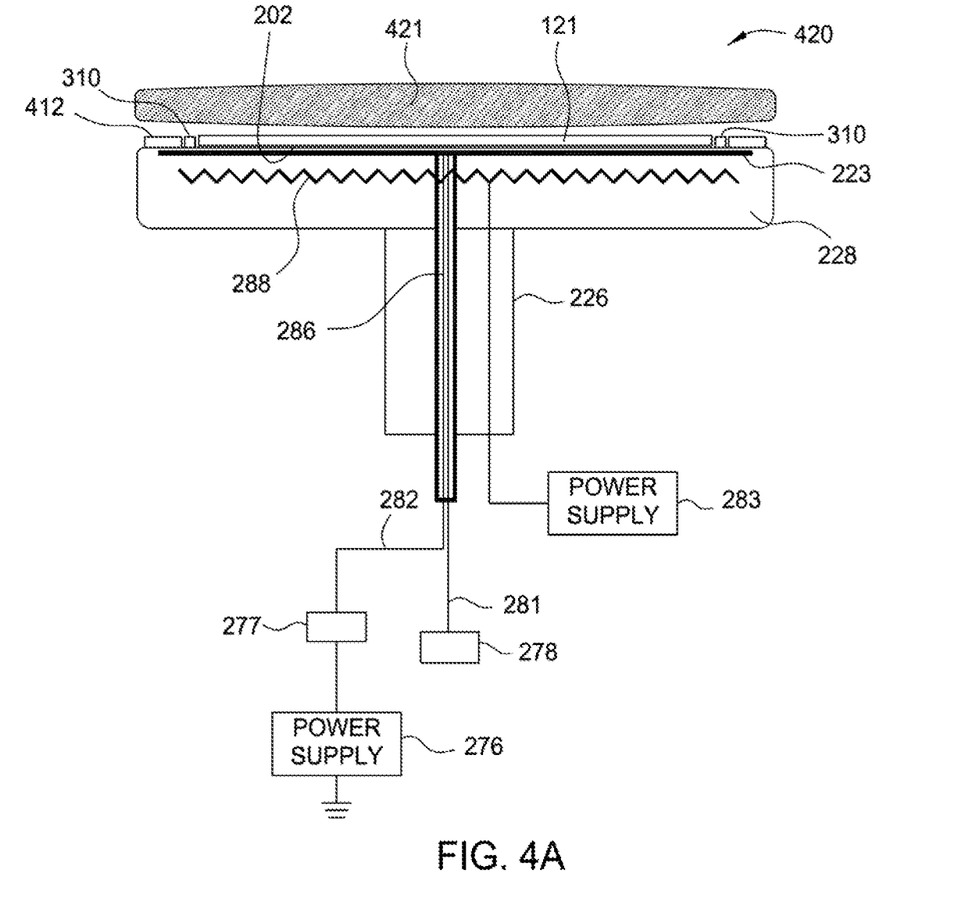
FIGS. 4A to 4B illustrate schematic cross-sectional views of an electrostatic chuck according to another embodiment of the present disclosure.

FIG. 4A illustrates a schematic cross-sectional view of an electrostatic chuck 420 according to another embodiment of the present disclosure. The embodiment shown in FIG. 4A is substantially identical to FIG. 3A except that an edge ring is disposed radially external to the tabs 301. In this embodiment, an edge ring 412 is disposed atop the top surface 202 of the electrostatic chuck 420. The tabs 301 are surrounded by the edge ring 412.

Figure 4B:
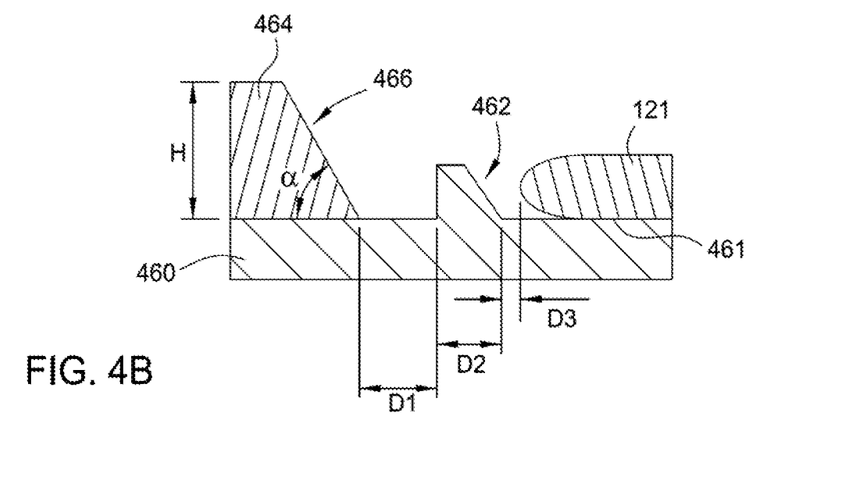

FIG. 4B illustrates an enlarged cross-sectional view of a portion of the electrostatic chuck 460 according to one another embodiment of the present disclosure. The electrostatic chuck 460 may be identical to FIGS. 3A-3C except that a trapezoid or wedge shaped edge ring is added. In the embodiment as shown, the tab 462 may have a trapezoid shaped to prevent the substrate 121 from sliding out of the substrate supporting surface 461. The edge ring 464 may also have a trapezoid shaped for controlling local plasma density. It has been observed that the height "H" and inner diameter "R" of the edge ring 464 defining its gas to the substrate edge can be used to modulate local plasma especially in substrate edge area. The height "H" may vary between about 0.03 inches and about 0.10 inches, for example about 0.05 inches, depending upon the process application. In some configurations, the slope 466 of the edge ring 464 may have an angle "α" of about 10° to 90° with respect to the substrate supporting surface 461.

Table 1 below shows some examples of the angle "α" and the inner diameter "R" of the edge ring 464.

TABLE 1

|  | Embodiment | | | | | | |
| --- | --- | --- | --- | --- | --- | --- | --- |
|  | 1 | 2 | 3 | 4 | 5 | 6 | 7 |
| α (degree) | 90 | 90 | 10 | 90 | 10 | 90 | 10 |
| R (in) | 6.050 | 6.100 | 6.100 | 6.300 | 6.300 | 6.500 | 6.500 |

In some embodiments, the distance "D1" between the inner diameter "R" of the edge ring 464 and the outer diameter of the tab 462 is about 0.060 inches to about 0.500 inches. The distance "D2" between the outer diameter of the tab 462 and the inner diameter of the tab 462 is about 0.07 inches to about 0.09 inches. The distance "D3" between the inner diameter of the tab 462 and the edge of the substrate 121 may be about 0.040 inches to about 0.050 inches.

In some embodiments, the edge rings 412, 464 may be made of a material having the same dielectric constant as the material of the electrostatic chuck 420, 460. In some embodiments, the edge rings 412, 464 may be made of a material having a dielectric constant that is different from the material of the electrostatic chuck 420, 460. In such a case, the edge rings 412, 464 may be made of a material having a dielectric constant similar to that of the substrate 121, allowing a more uniform electromagnetic field (and thus plasma 421) to produce above the substrate. The edge rings 412, 464 may have a thermal conductivity similar to that of the tabs 301 and the substrate 121, thereby providing a more uniform temperature gradient proximate the edge of the substrate 121, thus further reducing process non-uniformities.

In either configuration shown in FIG. 4A or 4B, the materials of the edge rings 412, 464 can be used to module the local EM field for compensate plasma non-uniformity. The materials of edge rings 412, 464 may have different dielectric constant than the substrate 121. Suitable materials for the edge ring 412, 464 may include, but are not limited to quartz, aluminum nitride (AlN), aluminum oxide ($Al_2O_3$), silicon nitride (SiN), yttrium containing materials, yttrium oxide ($Y_2O_3$), yttrium-aluminum-garnet (YAG), titanium oxide (TiO), titanium nitride (TiN), silicon carbide (SiC), ASMY (aluminum oxide silicon magnesium yttrium), high performance material (HPM) composing of a compound of $Y_4Al_2O_9$ (YAM) and a solid solution of $Y_{2-x}Zr_xO_3(Y_2O_3$—$ZrO_2$ solid solution), magnesium oxide (MgO), zirconia ($ZrO_2$), titanium carbide (TiC), boron carbide ($B_xC_y$), boron nitride (BN), and other similar or different properties which can satisfy the same requirement discussed herein.

In some embodiments, the electrode 223 may be two separate electrodes, i.e., an inner electrode and an outer electrode surrounding the inner electrode, arranged in a way as shown in the embodiment of FIG. 2C. The inner electrode and the outer electrode may be concentric. The inner electrode and the outer electrode may be not-coplanar and can be electrically connected to each other via an electrical connection to adjust the electromagnetic field proximate the edge of the substrate. The outer electrode may be disposed such that it is relatively below or above the inner electrode.

Figure 5A:
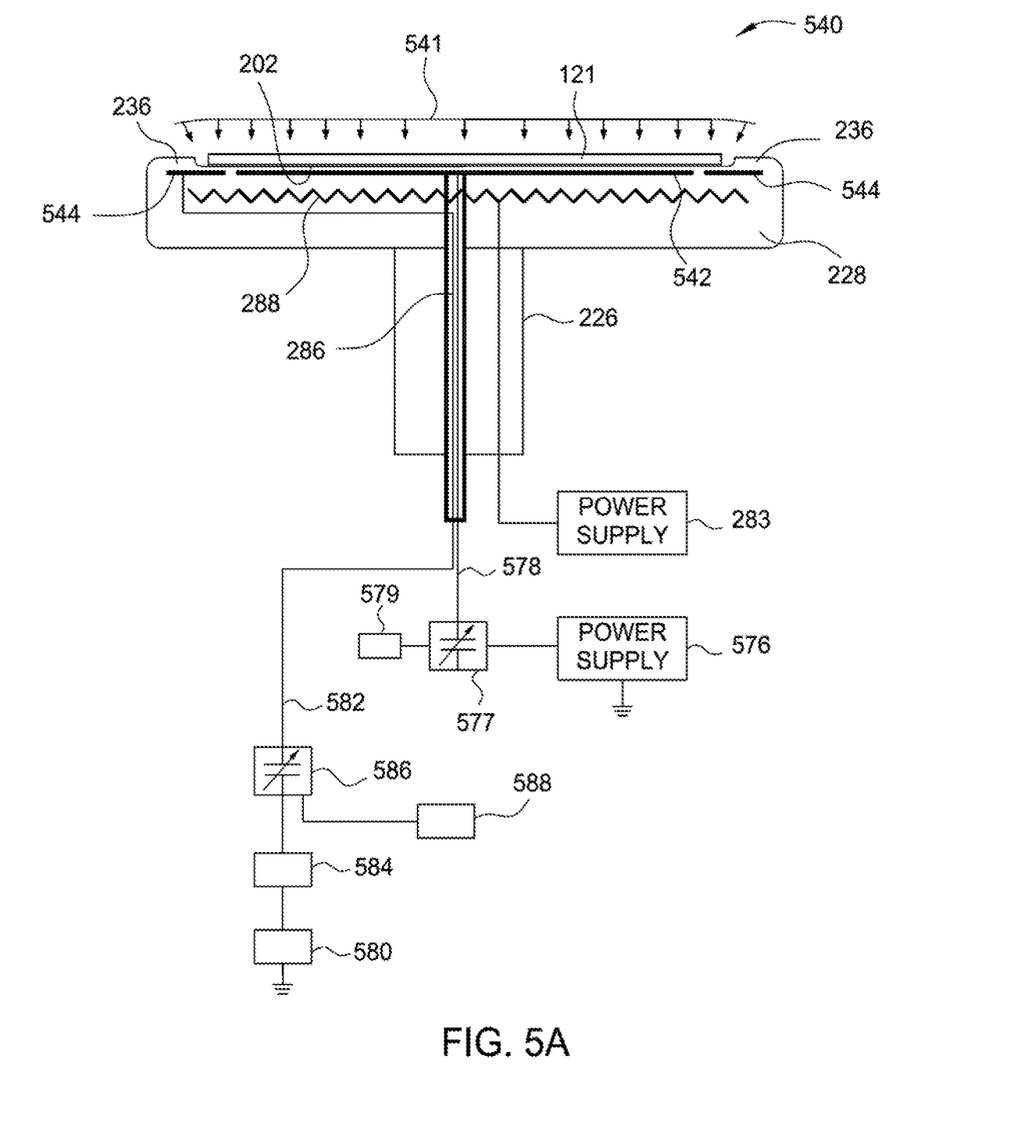
FIGS. 5A and 5B illustrate schematic cross-sectional views of an electrostatic chuck according to embodiments of the present disclosure.
Figure 5B:
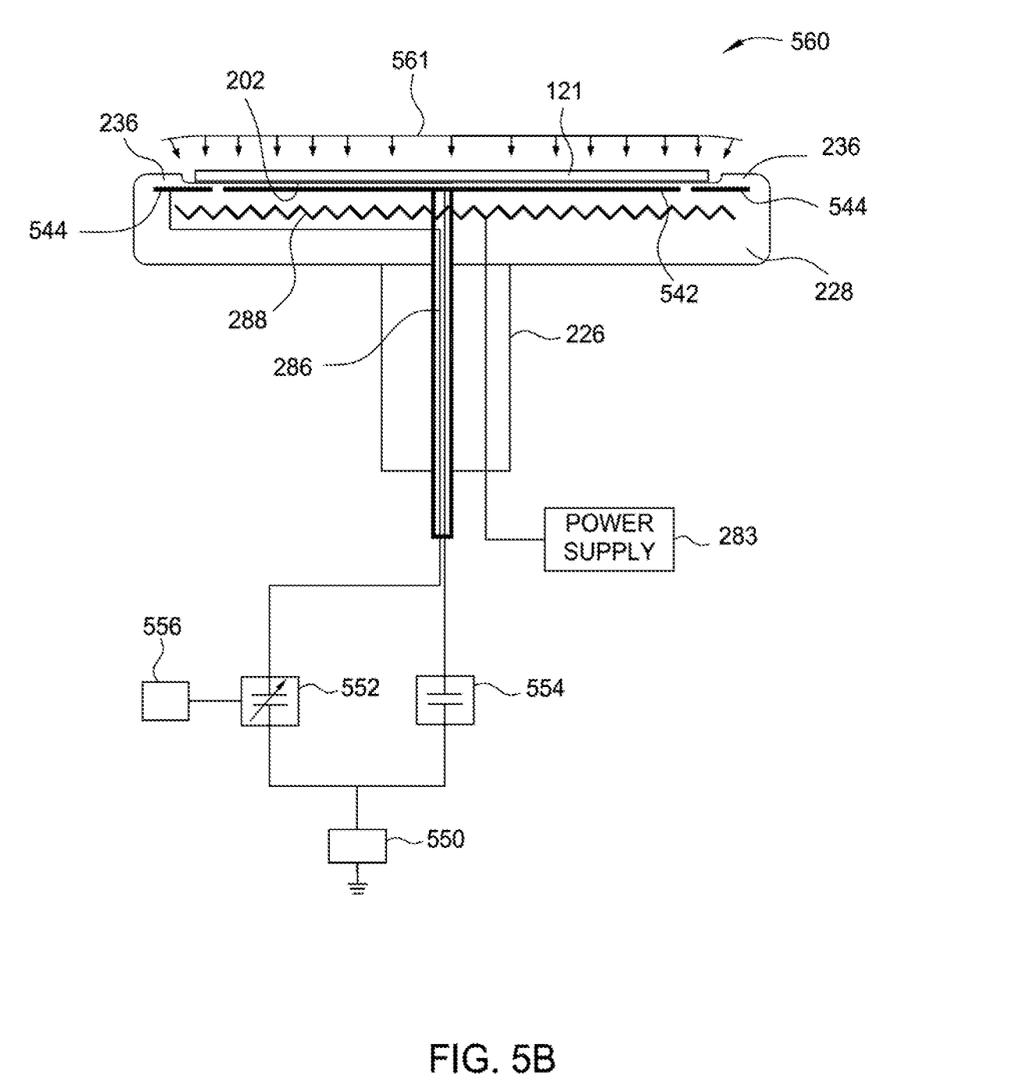

FIGS. 5A and 5B illustrate schematic cross-sectional views of an electrostatic chuck according to embodiments of the present disclosure. Embodiments shown in FIGS. 5A and 5B are substantially identical to those shown in FIGS. 2A to 2C except that a dual electrode having individual adjustable capability is adapted. In the embodiment shown in FIG. 5A, the electrostatic chuck 540 comprises two separate electrodes, i.e., an inner electrode 542 and an outer electrode 544 surrounding the inner electrode 542. The inner electrode 542 and the outer electrode 544 may be concentric. In one embodiment, the inner electrode 542 and the outer electrode 544 are coplanar. In one embodiment, the inner electrode 542 and the outer electrode 544 are non-coplanar. For example, the inner electrode 542 may be disposed relatively below the outer electrode 544, or vice versa. Alternatively, the inner electrode 542 may be disposed such that a distance between the inner electrode 542 and the top surface 202 is the same, or different (greater or smaller) than that of a distance between the outer electrode 544 and a top surface of the annular shoulder 236.

The inner electrode 542 may be fabricated from the same, or in some embodiments, a different material, than the outer electrode 544. Suitable material for the inner and outer electrodes 542, 544 may be those discussed above with respect to the electrode 223. For example, the inner electrode 542 may be made from copper, nickel, or alloys thereof, while the outer electrode 544 may be made from aluminum and alloys thereof.

The inner electrode 542 may extend radially from a center of the electrostatic chuck 540 to an area close to the edge of the substrate 121. Alternatively, inner electrode 542 may extend radially from the center of the electrostatic chuck 540 to an area beyond the edge of the substrate 121. The outer electrode 544 may extend outwardly from an area close to the edge of the substrate 121 to the annular shoulder 236, and may extend radially to a region beneath the annular shoulder 236. The inner and outer electrodes 542, 544 therefore form two separate electrode zones which are concentric and insulated from each other. A greater or lesser number of electrodes may be employed, depending upon the application. If desired, the inner and outer electrodes 542, 544 may not be concentric as long as they are positioned relative to each other to create a desired, spatial profile of the electromagnetic field above the substrate.

The inner electrode 542 may be supplied with a DC chucking voltage to electrostatically hold the substrate 121 on the electrostatic chuck 540. The inner electrode 542 may also be configured to carry both the RF bias voltage and the DC chucking voltage, both of which may be applied by power supply 576 though an electrical connection 578. The power supply 576 may include an AC voltage source for providing a plasma generating RF voltage to the inner electrode 542 and optionally, a DC voltage source for providing a chucking voltage to the inner electrode 542. The AC voltage supply provides an RF generating voltage having one or more frequencies from, for example, 400 KHz to 60 MHz at a power level of typically from about 50 to about 3000 Watts. The DC voltage of about 200 to about 2000 volts may be applied to the inner electrode 542 to provide an electrostatic charge that holds the substrate 121 to the electrostatic chuck 540. The power supply 576 can also include a system controller for controlling the operation of the inner electrode 542 by directing a DC current, and RF current, or both, to the inner electrode 542 for chucking and dechucking the substrate 121 and for sustaining or energizing a plasma above the substrate 121.

In some embodiments where the power supply 576 provides RF bias voltage, a variable capacitor 577 may be optionally disposed between the inner electrode 542 and the power supply 576. The variable capacitor 577 is individually controllable or tunable by a controller 579, which functions to individually adjust the variable capacitor 577 in order to achieve a desired spatial distribution of the plasma generated within the chamber. Control of the spatial distribution of the plasma is achieved by controlling of the RF bias voltage that is coupled by the variable capacitor 577 to the inner electrode 542. For example, the variable capacitor 577 may be tuned by the controller 579 so as to reduce the RF bias voltage applied to the inner electrode 542, which in turn would reduce the electromagnetic field, and thus the plasma density near the center of the substrate 121.

The outer electrode 544 is coupled to an RF power source 580 via an electrical connection 582. The RF power source 580 is conditioned by a matching network 584 and capacitively coupled to the outer electrode 544 by a variable capacitor 586. The matching network 584 functions to minimize the reflection of RF back from the processing chamber which would otherwise reduce the efficiency of the generated plasma. Such power reflection is generally caused by a mismatch in the impedance of the RF power source 580 and a load which is formed by the combination of the electrostatic chuck 540 and the plasma generated within the chamber (e.g., the chamber body 102 of FIG. 1).

The variable capacitor 586 is individually controllable or tunable by a controller 588, which functions to individually adjust the variable capacitor 586 in order to achieve a desired spatial distribution of the plasma generated within the chamber. Control of the spatial distribution of the plasma is achieved by controlling of the RF bias voltage that is coupled by the variable capacitors 586 to the outer electrode 542. For example, if it is known that the plasma density has a tendency to be lower near the edge of the substrate 121, then the variable capacitor 586 is adjusted by the controller 588 so as to slightly increase the RF bias voltage applied to the outer electrode 544. As a result, a uniform electromagnetic field 541 above the substrate 121 and the annular shoulder 236 is provided.

While FIG. 5A shows the inner and outer electrodes 542, 544 are connected to a respective variable capacitor, in some embodiments only one of the inner and outer electrodes 542, 544 is connected to a variable capacitor. FIG. 5B shows a schematic cross-sectional view of an electrostatic chuck 560 according to another embodiment of the present disclosure. Embodiment of FIG. 5B is similar to FIG. 5A except that the inner and outer electrodes 542, 544 are powered by the same power source. In this embodiment, the inner and outer electrodes 542, 544 are coupled to a common power source 550, which may include two or more power sources, such as a DC power source and an RF power source. In one embodiment, the outer electrode 544 is coupled to the power source 550 via a variable capacitor 552 while the inner electrode 542 is coupled to the power source 550 via a capacitor 554. The variable capacitor 552 is individually controllable or tunable by a controller 556, which functions to individually adjust the variable capacitor 552 in order to achieve a desired spatial distribution of the plasma proximate the edge of the substrate 121. By adjusting the position of the capacitor 554, ratio of each end of the capacitors 552, 554 can be adjustable. Embodiment of FIG. 5B allows for a uniform electromagnetic field 561 to be created above the substrate 121 and the annular shoulder 236.

Embodiments of the present disclosure provide an improved electrostatic chuck using an extending single electrode or dual electrodes (coplanar or non-coplanar) that are capable of producing an enhanced substrate edge electromagnetic field and uniform local plasma performance above the substrate disposed atop the electrostatic chuck during plasma processing processes. An electrostatic chuck with dual electrodes allows individual adjustable capability to provide a uniform electromagnetic field above the substrate reduces, or eliminates a bending of a plasma sheath of a plasma formed above the substrate, which in turn minimizes the differences in the ion trajectories bombarding the substrate proximate the edge of the substrate and the center of the substrate. As a result, a uniform processing of the substrate is achieved.

While the foregoing is directed to embodiments of the present disclosure, other and further embodiments of the disclosure may be devised without departing from the basic scope thereof.

The invention claimed is:

1. An electrostatic chuck for supporting a substrate, comprising:
    a chuck body coupled to a support stem, the chuck body comprising:
        a planar substrate supporting surface having an outer circumference, wherein the planar substrate supporting surface forms a continuous planar surface from a center of the chuck body to the outer circumference; and
        a plurality of tabs projecting above the planar substrate supporting surface of the chuck body, the plurality of tabs each having an outer edge positioned a radial distance from a center of the planar substrate supporting surface, the radial distance less than the outer circumference;
    an electrode embedded within the chuck body, the electrode extending radially from a center of the chuck body to a region beyond the plurality of tabs; and
    a first electrical connection for coupling an RF power source to the electrode.

2. The electrostatic chuck of claim 1, further comprising: a chucking power source coupling to the electrode via a second electrical connection.

3. The electrostatic chuck of claim 1, wherein the electrode comprises an inner electrode and an outer electrode surrounding the inner electrode.

4. The electrostatic chuck of claim 3, wherein the inner electrode and the outer electrode are non-coplanar.

5. The electrostatic chuck of claim 4, wherein the inner electrode is disposed below the outer electrode.

6. The electrostatic chuck of claim 1, wherein the chuck body comprises aluminum nitride or aluminum oxide.

7. An electrostatic chuck for supporting a substrate, comprising:
    a body coupled to a support stem, the body having a substrate supporting surface;
    an annular shoulder projecting from the substrate supporting surface, the annular shoulder being disposed at a periphery of the body;
    an inner electrode having an outer edge, the inner electrode embedded within the body, the inner electrode extending radially from a center of the body to a region adjacent to the annular shoulder;
    an outer electrode having an inner edge and an external edge, the outer electrode embedded within the body, wherein the outer electrode is disposed radially external to the inner electrode, the outer electrode extends radially beneath the annular shoulder, and the outer electrode is disposed below the inner electrode;
    a conductive connection disposed between the inner electrode and the outer electrode, the conductive connection physically connecting the outer edge of the inner electrode to the inner edge of the outer electrode, the conductive connection electrically connecting the inner electrode and the outer electrode; and
    a first electrical connection for coupling an RF power source to the inner electrode.

8. The electrostatic chuck of claim 7, further comprising: a second electrical connection for coupling a chucking power source to the inner electrode.

9. The electrostatic chuck of claim 7, further comprising: one or more heating elements embedded in the body, wherein the heating elements are disposed beneath the inner electrode.

* * * * *